United States Patent
Wang

(10) Patent No.: US 8,125,063 B2
(45) Date of Patent: Feb. 28, 2012

(54) COL PACKAGE HAVING SMALL CHIP HIDDEN BETWEEN LEADS

(75) Inventor: Chin-Fa Wang, Hsinchu (TW)

(73) Assignee: Powertech Technology, Inc., Hsinchu (TW)

( * ) Notice: Subject to any disclaimer, the term of this patent is extended or adjusted under 35 U.S.C. 154(b) by 151 days.

(21) Appl. No.: 12/719,490

(22) Filed: Mar. 8, 2010

(65) Prior Publication Data
US 2011/0215454 A1   Sep. 8, 2011

(51) Int. Cl.
*H01L 23/495* (2006.01)
*H01L 23/48* (2006.01)

(52) U.S. Cl. ........ 257/676; 257/666; 257/686; 257/777; 257/E25.005; 257/E25.006; 257/E25.027; 257/E23.031; 257/E23.039; 257/E23.085

(58) Field of Classification Search .......... 257/666–676, 257/692–696, 725, 777, E23.031, E23.506, 257/E23.004, E23.043, E23.05, 686, E25.005, 257/E25.006, E25.027, E23.039, E23.085; 438/123; 361/760–762
See application file for complete search history.

(56) References Cited

U.S. PATENT DOCUMENTS
7,830,020 B2 * 11/2010 Dahilig et al. ................ 257/777

FOREIGN PATENT DOCUMENTS
JP        5-315528        * 11/1993
* cited by examiner Primary Examiner — Jasmine Clark
(74) Attorney, Agent, or Firm — Muncy, Geissler, Olds & Lowe, PLLC

(57) ABSTRACT

A Chip-On-Lead (COL) type semiconductor package having small chip hidden between leads is revealed. The lower surfaces of the leadframe's leads are attached to a wiring substrate and the leads are horizontally bent to form a die-holding cavity. A smaller chip is disposed on the wiring substrate by passing through the die-holding cavity to be on the same disposing level with the leads. At least a larger chip is disposed on the leads to overlap the smaller chip so that the small chip does not extrude from the leads. The encapsulant encapsulates a plurality of internal parts of the leads, the wiring substrate, and the larger chip. Therefore, the conventional unbalance issue of mold flow above and below the leads leading to cause excessive warpage can be avoided and numbers of stacked larger chips can be increased to have larger memory capacities.

20 Claims, 5 Drawing Sheets

COL PACKAGE HAVING SMALL CHIP HIDDEN BETWEEN LEADS

FIELD OF THE INVENTION

The present invention relates to a semiconductor device, and more particularly to a Chip-On-Lead (COL) type semiconductor package.

BACKGROUND OF THE INVENTION

There are various semiconductor packages for semiconductor chips such as TSOP, MSOP and QSOP which are implemented in memory devices or memory cards in consumer electronics. The most popular packages for memory devices are leadframe-based LOC (Lead-On-Chip) packages and COL (Chip-On-Lead) packages where LOC packages including semiconductor chips disposed under the leads are designed for chips with central pads and COL packages including semiconductor chips disposed on top of the leads are designed for chips with peripheral pads. When packaging multiple chips within in a COL package, small chips usually cause uneven encapsulant distribution and affect mold flow balance.

As shown in FIG. 1 and FIG. 2, a conventional COL type semiconductor package 100 comprises a plurality of leadframe's leads 110, a wiring substrate 120, a first chip 130, a second chip 140, and an encapsulant 150. The leads 110 includes a plurality of first side leads 112 and a plurality of second side leads 113 where the first side leads 112 are longer than the second side leads 113 to support the chips 130, 140 and the wiring substrate 120. The first chip 130 is a controller chip with a smaller dimension and the second chip 140 is a flash memory with a larger dimension. The wiring substrate 120 is to integrate electrical signals between the chips 130, 140 within the package 100. During packaging of 3D stacking, the component with larger dimension is stacked first followed by component with a smaller dimension where the second chip 140 is disposed on the second side leads 113 and the wiring substrate 120 is disposed on the second chip 140 and the first chip 130 is disposed on the wiring substrate 120. The wiring substrate 120 is electrically connected to the leads 110 by a plurality of first bonding wires 161, the second chip 140 is electrically connected to the wiring substrate 120 by a plurality of second bonding wires 162 and the first chip 130 is electrically connected to the wiring substrate 120 by a plurality of third bonding wires 163, so that the first chip 130, the second chip 140, the wiring substrate 120 and the leads 110 are all electrically connected together. The encapsulant 150 encapsulates a plurality of internal parts 111A of the leads 110, the wiring substrate 120, the first chip 130 and the second chip 140 with a plurality of external parts of the leads 110 extend and bend downward from two corresponding sides of the encapsulant 150 for external electrical connections.

In the conventional COL type semiconductor package, the first chip 130 with a smallest dimension is stacked on the most top of the stacked structure. Since the first chip 130 is smaller and extruded from the leads 110 during the molding of the encapsulant 150, so that the mold cavity above the leads becomes larger with uneven encapsulant distribution leading to unbalanced encapsulant 150 above and below the leads 110 and unbalanced encapsulant 150 between center and peripheries. When temperature changes, the encapsulant 150 expands due to high temperature or shrink due to low temperature leading to warpage of the semiconductor package 100. Furthermore, unbalanced mold flow above and below leads 110 is an issue as well.

SUMMARY OF THE INVENTION

The main purpose of the present invention is to provide a Chip-On-Lead (COL) type semiconductor package having small chip hidden between leads to avoid the conventional unbalanced encapsulant above and below the leads leading to excessive warpage and unbalanced mold flow.

The second purpose of the present invention is to provide a Chip-On-Lead (COL) type semiconductor package having small chip hidden between leads to increase numbers of stacked larger chips to have larger memory capacities.

According to the present invention, a Chip-On-Lead (COL) type semiconductor package having small chip hidden between leads is revealed, primarily comprising a plurality of leadframe's leads, a wiring substrate, a first chip, a second chip, and an encapsulant. The leads are horizontally bent to form a die-holding cavity. The wiring substrate is disposed under the leads. The first chip is disposed on the wiring substrate by passing through the die-holding cavity to be on the same disposing level with the leads. The second chip is disposed on the leads to overlap the first chip. The encapsulant encapsulates a plurality of internal parts of the leads, the wiring substrate, and the second chip.

The Chip-On-Lead (COL) package having small chip hidden between leads according to the present invention has the following advantages and functions:
1. Through hiding the smaller chip between the leads and overlapped by a larger chip as a technical mean, the smaller chip does not extrude from the leads without occupying the upper volume of the encapsulant to avoid the conventional unbalanced encapsulant above and below the leads leading to excessive warpage and unbalanced mold flow.
2. Through hiding the smaller chip between the leads as a technical mean, numbers of stacked larger chips can be increased to have larger memory capacities.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
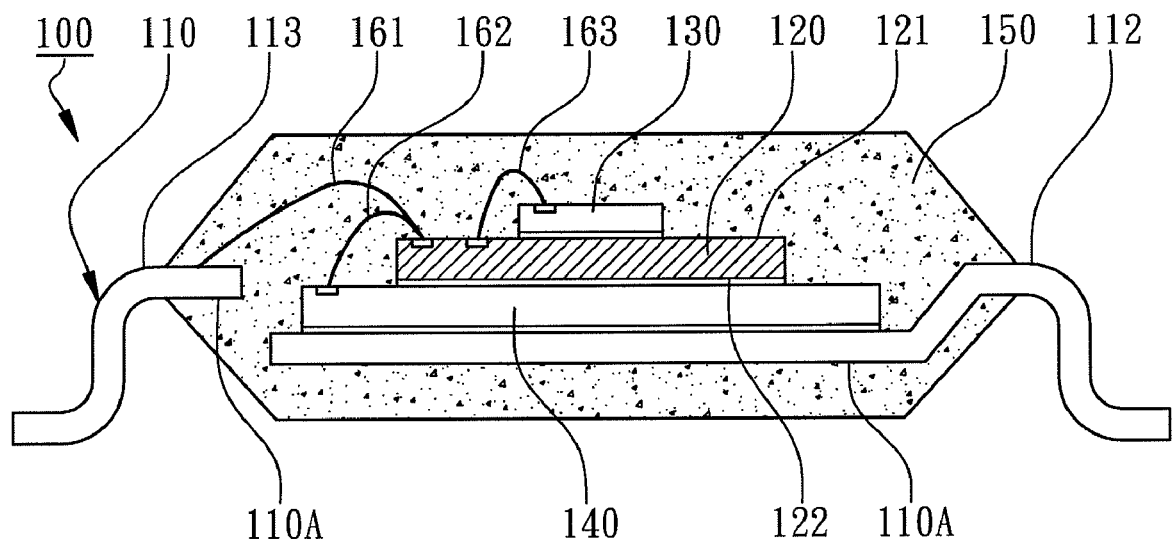
FIG. 1 is a cross-sectional view of a conventional COL type semiconductor package.
Figure 2:
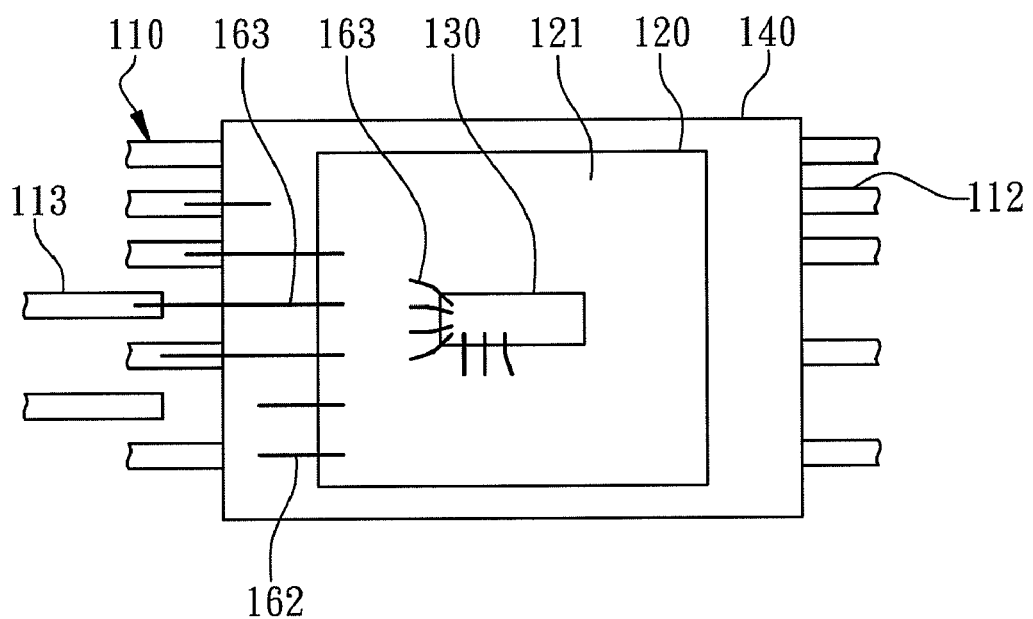
FIG. 2 is a partial top view of a conventional COL type semiconductor package before encapsulation.
Figure 3:
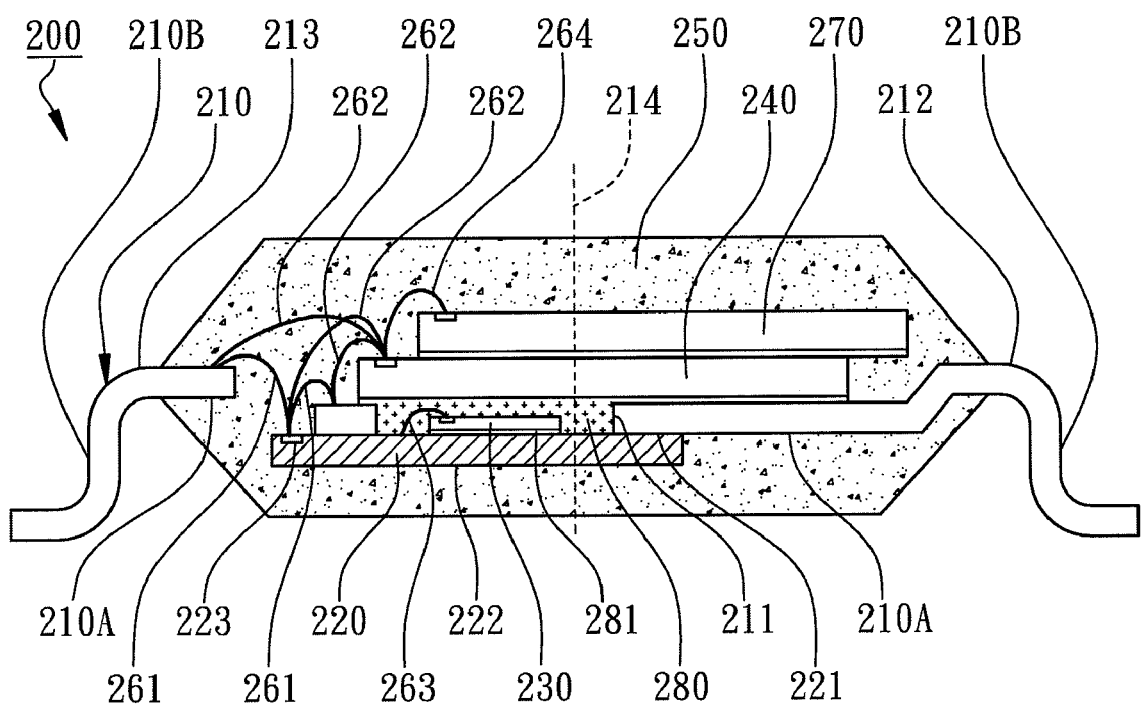
FIG. 3 is a cross-sectional view of a COL type semiconductor package having small chip hidden between leads according to a first embodiment of the present invention.
Figure 4:
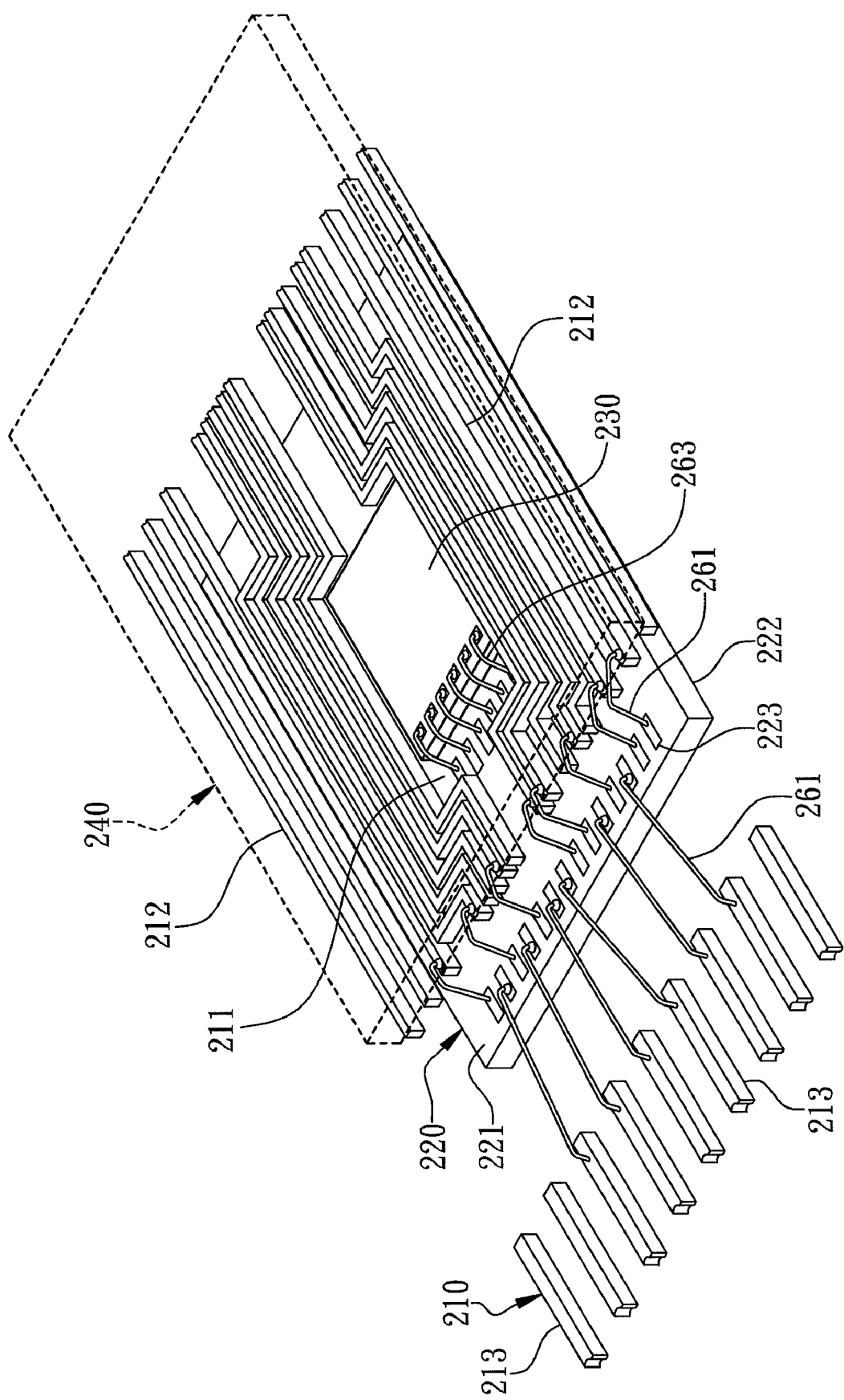
FIG. 4 is a partial 3D view of the COL type semiconductor package before encapsulation according to the first embodiment of the present invention.

According to the first embodiment of the present invention, a COL type semiconductor package having small chip hidden between leads is illustrated in FIG. 3 for a cross-sectional view and in FIG. 4 for a partial 3D view. The COL type semiconductor package 200 primarily comprises a plurality of leadframe's leads 210, a wiring substrate 220, a first chip 230, a second chip 240, and an encapsulant 250 where the second chip 240 is disposed on the leads 210 and the encapsulant 250 at least encapsulates the second chip 240 to be COL type. Moreover, the COL type semiconductor package 200 conforms to a multi-chip packaging type.

Figure 5:
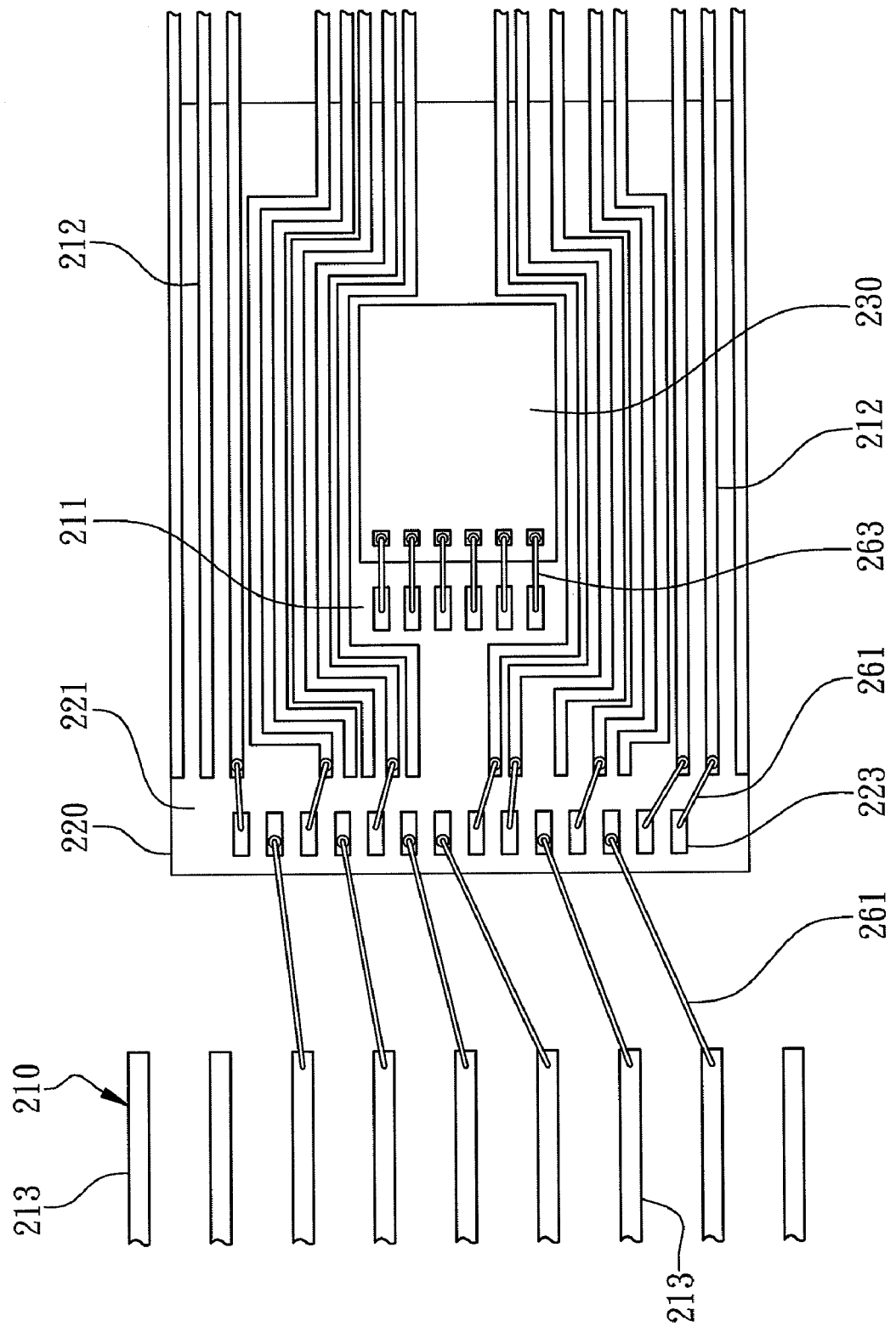
FIG. 5 is a partial top view of the COL type semiconductor package before encapsulation and before disposing the second chip according to the first embodiment of the present invention.

As shown in FIG. 3, the leads 210 includes a plurality of first side leads 212 and a plurality of second side leads 213 where the first side leads 212 is longer than the second side leads 213 exceeding a central line 214 of the encapsulant 250. The central line 214 is a straight line served as a central line for the COL type semiconductor package 200 which is located at the center and parallel to two corresponding parallel sides of the encapsulant 250. The first side leads 212 and the second side leads 213 are made from the same leadframe to have the same metal material and lead thickness which is normally formed by copper or iron having individual supporting thicknesses Preferably, the first side leads 212 are downset relative to the second side leads 213. The most special characteristic is the leads 210 are horizontally bent to form a die-holding cavity 211 between the leads 210 such as a double U-shape cavity with concave bilateral, i.e., one U-shaped opening facing to another U-shaped opening, as shown in FIG. 4 and FIG. 5. The horizontal direction is parallel to the disposing level of the second chip 240. Therein, the disposing level is a plane for disposing a component, for example, the disposing level of the second chip 240 is the upper surfaces of the first side leads 212. To be more specific, the die-holding cavity 211 is defined by the first side leads 212 which means that the die-holding cavity 211 is formed between the first side leads 212 where the dimension of the die-holding cavity 211 is a square and is slightly larger than the first chip 230. In the present embodiment, the die-holding cavity 211 is align with the central line 214 but is not limited where the location of the die-holding cavity 211 can be adjusted according to the pre-designed location of the first chip 230.

As shown in FIG. 3 and FIG. 4, the wiring substrate 220 is disposed under the leads 210 where the first chip 230 is disposed on the wiring substrate 220 by passing through the die-holding cavity 210 to be in the same disposing level with the leads 210. The second chip 240 is disposed on the leads 210 to overlap the first chip 230, that is to say, the second chip 240 is larger than the first chip 230 and has a footprint completely covering the first chip 230. Accordingly, the first chip 230 is no longer a negative factor to affect moldflow balance. Furthermore, the COL type semiconductor package 200 may further comprises at least a third chip 270 which has the same dimension as the second chip 240. In the present embodiment, the second chip 240 and the third chip 270 are stepwise stacked without overlapping a plurality of bonding pads of the second chip 240 so that the bonding wires 262 connecting the bonding pads can be formed after the third chip 270 is stacked. In the present embodiment, the first chip 230 is a controller chip or a small chip type component such as SMD passive components and logic chips. The second chip 240 is a memory chip such as NAND flash or NOR flash memory so that the first chip 230 is smaller than the second chip 240. Therefore, a plurality of chips with different functions can be assembled in the same COL type semiconductor package to increase the design flexibility of chips. Furthermore, the second chip 240 and the third chip 270 are non-volatile memory chips with the same dimension and memory capacity having the same bonding pad design. Therefore, when comparing to the conventional COL multi-chip package, the first chip 230 with a smaller dimension is hidden between the leads 210 without occupying any space of the top molding volume to avoid the conventional unbalanced encapsulant above and below the leads leading to excessive warpage and unbalanced mold flow. Moreover, since the first chip 230 does not extrude from the leads 210, more larger chips can be stacked on the second chip 240 to increase the memory capacities within in the same package. Alternatively, the downset degree of the first side leads 212 can be reduced.

Preferably, the first chip 230 is disposed inside the die-holding cavity 211, and the thickness of the first chip 230 is not greater than the thickness of the leads 210. When the second chip 240 is disposed above the leads 210, the back surface of the second chip 240 is not in contact with the fully covered first chip 230. In a more specific embodiment, the thickness of the first chip 230 is 40 um, and the thickness of the leads 210 ranges from 75 um to 400 um.

To be described in more detail, the wiring substrate 220 is a printed circuit board made of glass fiber reinforced resin or ceramic substrates. The wiring substrate 220 has a top surface 221 and a bottom surface 222. The wiring substrate 220 further has a plurality of bonding fingers 223 disposed on the top surface 221 and located at the gap between the first side leads 212 and the second side leads 213 for short wire-bonding processes. The wiring substrate 220 has an appropriate circuitry to electrically connect to the corresponding bonding fingers 223, not shown in the figures.

As shown in FIG. 3, the COL type semiconductor package 200 further comprises a plurality of first bonding wires 261 and a plurality of second bonding wires 162. The wiring substrate 220 is electrically connected to the leads 210 by the first bonding wires 261. The second chip 240 is electrically connected to the leads 210 and the wiring substrate 230 by the second bonding wires 262. Moreover, the COL type semiconductor package 200 further comprises a plurality of third bonding wires 263 and a plurality of fourth bonding wires 264 where the first chip 230 is electrically connected to the wiring substrate 220 by the third bonding wires 263 and the third chip 270 is electrically connected to the second chip 240 by the fourth bonding wires 264. The bonding wires 261, 262, 263, and 264 are formed by wire bonding. The first wire bonding processes are executed after disposing the first chip 230 to the top surface 221 of the wiring substrate 220 to form the third bonding wires 263 as well as the first bonding wires 261. Then, the second wire bonding processes are also executed after disposing the second chip 240 and the third chip 270 to form the bonding wires 262 and 264. Preferably, the loop height of the third bonding wires 263 can be smaller than the thicknesses of the leads 210 to avoid damages of the third bonding wires 263 due to the attachment of the second chip 240.

As shown in FIG. 3, the encapsulant 250 encapsulates a plurality of internal parts 210A of the leads 210, the wiring substrate 220, and the second chip 240 to avoid external contaminations from the environment. The encapsulant 250 includes thermosetting resin with the function of electrical isolation such as epoxy molding compound (EMC). The encapsulant 250 also encapsulates the bonding wires 261, 262, and 264. Moreover, the internal parts 210A are portions of the leads 210 embedded inside the encapsulant 250, each lead 210 further has an external part 210B extended outside the encapsulant 250 where the external lead 210B are extended from the sides of the encapsulant 250 and downwardly bent into gull lead or other shapes such as I-lead or J-lead. In the present embodiment, the internal parts 210A of the first side leads 212 which is encapsulated by the encapsulant 250 can be downset bent to accommodate more chips.

Preferably, as shown in FIG. 3, the COL type semiconductor package 200 further comprises an adhesive material 280 adhering the second chip 240 to the leads 210 and encapsulate the first chip 230 to enhance the adhesion strength and to avoid air trapped in the die-holding cavity 211. Most preferable, the adhesive material 280 can fill the die-holding cavity 211 to overlap the first chip 230 and the third bonding wires 263 to avoid difficulties of filling molding compound into the die-holding cavity 211 leading to molding bubbles. The adhesive material 280 can be liquid-type or paste-type die-attaching material such as epoxy or B-stage resin formed by low cost processes such as dispensing or printing. Furthermore, the first chip 230 is attached to the wiring substrate 220 by a die-attaching layer 281 such as PI tapes or B-stage paste disposed on the back surface of the chips in wafer form.

Figure 6:
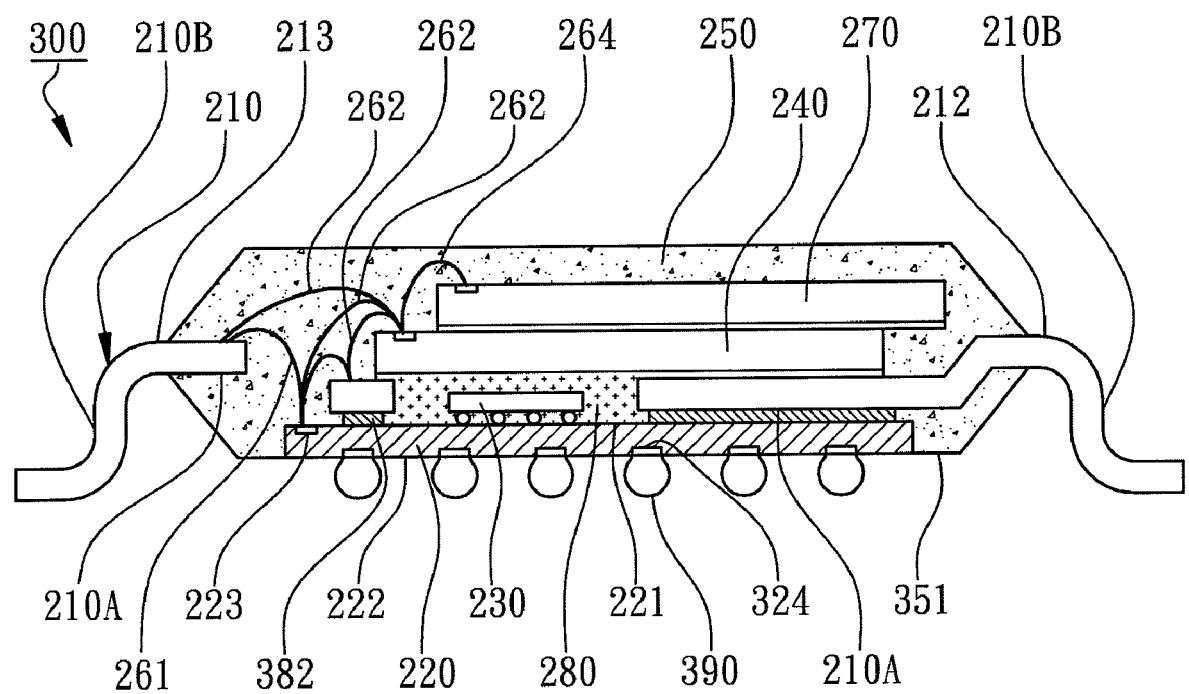
FIG. 6 is a cross-sectional view of another COL type semiconductor package according to a second embodiment of the present invention.

According to the second embodiment of the present invention, another Chip-On-Lead (COL) package having small chip hidden between leads is illustrated in FIG. 6 for a cross-sectional view. The COL type semiconductor package 300 primarily comprises a plurality of leads of a leadframe, a wiring substrate 220, a first chip 230, a second chip 240, and an encapsulant 250 where the major components will be illustrated with the same symbols and numbers which will not be described in detail again.

The COL type semiconductor package 300 further comprises a plurality of die-attaching adhesive bars 382, such as double-side PI tapes or preform sheets, attached to parts of the bottom surfaces of the first side leads 212 to adhere the top surface 221 of the wiring substrate 220 to the leads 210.

The first chip 230 is disposed on the top surface 221 of the wiring substrate 220 by passing through the die-holding cavity 221 to keep the first chip 230 on the same disposing level with the leads 210. In the present embodiment, the first chip 230 is flip-chip attached to the wiring substrate 220 so that the active surface of the first chip 230 faces downward. Preferably, the die-attaching material 280 adhered to the second chip 240 includes an underfill material to fill into the gap between the leads 210 within the die-holding cavity 221 to avoid air trapped in the second chip 240 and the wiring substrate 220.

In the present embodiment, the bottom surface 222 of the wiring substrate 220 is exposed from the bottom 351 of the encapsulnat 250 so that a plurality of external connecting pads 324 disposed on the bottom surface 222 are also exposed from the encapsulant 250 to be the external connecting terminals for the COL type semiconductor package 300.

The COL type semiconductor package 300 further comprises a plurality of solder balls 390 jointed to the external connecting pads 324 for external connections to increase I/O channels of the COL type semiconductor package 300 to add more functions to the COL type semiconductor package 300. The external leads 210B can be downwardly bent to have the same SMT level as the solder balls 390 for external electrical connections.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A Chip-On-Lead (COL) type semiconductor package comprising:
   a plurality of leads of a leadframe, wherein the leads are horizontally bent to form a die-holding cavity;
   a wiring substrate disposed under the leads;
   a first chip disposed on the wiring substrate by passing through the die-holding cavity to be on the same disposing level with the leads;
   a second chip disposed on the leads to overlap the first chip;
   an encapsulant encapsulating a plurality of internal parts of the leads, the wiring substrate; and the second chip;
   a plurality of first bonding wires electrically connecting the wiring substrate to the leads; and
   a plurality of second bonding wires electrically connecting the second chip to the leads and to the wiring substrate.

2. The semiconductor package as claimed in claim 1, further comprising a plurality of third bonding wires electrically connecting the first chip to the wiring substrate.

3. The semiconductor package as claimed in claim 1, wherein the leads includes a plurality of first side leads and a plurality of second side leads where the first side leads is longer than the second side leads exceeding a central line of the encapsulant and the die-holding cavity is defined by the first side leads.

4. The semiconductor package as claimed in claim 3, wherein the wiring substrate has a plurality of bonding fingers disposed on a top surface of the wiring substrate and located at a gap between the first side leads and the second side leads.

5. The semiconductor package as claimed in claim 3, wherein the first side leads are downset relative to the second side leads.

6. The semiconductor package as claimed in claim 1, wherein the first chip is a controller chip and the second chip is a memory chip, wherein the first chip is smaller than the second chip.

7. The semiconductor package as claimed in claim 6, further comprising at least a third chip disposed on the second chip having the same dimension as the second chip.

8. The semiconductor package as claimed in claim 7, wherein the second chip and the third chip are stepwise stacked without overlapping a plurality of bonding pads of the second chip.

9. The semiconductor package as claimed in claim 1, wherein the wiring substrate has a bottom surface exposed from the bottom of the encapsulant and a plurality of external connecting pads disposed on the bottom surface.

10. The semiconductor package as claimed in claim 9, further comprising a plurality of solder balls jointed to the external connecting pads.

11. The semiconductor package as claimed in claim 1, further comprising a die-attaching material adhering the second chip to the leads and encapsulating the first chip.

12. The semiconductor package as claimed in claim 11, wherein the die-attaching material includes an underfilling material.

13. The semiconductor package as claimed in claim 1, wherein the thickness of the first chip is not greater than the thickness of the leads.

14. A Chip-On-Lead (COL) type semiconductor package comprising:
   a plurality of leads of a leadframe, wherein the leads are horizontally bent to form a die-holding cavity;
   a wiring substrate disposed under the leads;

a first chip disposed on the wiring substrate by passing through the die-holding cavity to be on the same disposing level with the leads;
a second chip disposed on the leads to overlap the first chip; and
an encapsulant encapsulating a plurality of internal parts of the leads, the wiring substrate, and the second chip;
wherein the leads includes a plurality of first side leads and a plurality of second side leads where the first side leads is longer than the second side leads exceeding a central line of the encapsulant and the die-holding cavity is defined by the first side leads.

15. The semiconductor package as claimed in claim 14, wherein the wiring substrate has a plurality of bonding fingers disposed on a top surface of the wiring substrate and located at a gap between the first side leads and the second side leads.

16. The semiconductor package as claimed in claim 14, wherein the first side leads are downset relative to the second side leads.

17. A Chip-On-Lead (COL) type semiconductor package comprising:
   a plurality of leads of a leadframe, wherein the leads are horizontally bent to form a die-holding cavity;
   a wiring substrate disposed under the leads;
   a first chip disposed on the wiring substrate by passing through the die-holding cavity to be on the same disposing level with the leads;
   a second chip disposed on the leads to overlap the first chip;
   a die-attaching material adhering the second chip to the leads and encapsulating the first chip, wherein the die-attaching material includes an underfilling material; and
   an encapsulant encapsulating a plurality of internal parts of the leads, the wiring substrate, and the second chip.

18. The semiconductor package as claimed in claim 17, wherein the wiring substrate has a bottom surface exposed from the bottom of the encapsulant and a plurality of external connecting pads disposed on the bottom surface.

19. The semiconductor package as claimed in claim 18, further comprising a plurality of solder balls jointed to the external connecting pads.

20. The semiconductor package as claimed in claim 17, wherein the first chip is a controller chip and the second chip is a memory chip, wherein the first chip is smaller than the second chip, the semiconductor package further comprising at least a third chip disposed on the second chip having the same dimension as the second chip.

* * * * *